United States Patent
Sanderson et al.

(10) Patent No.: US 10,927,037 B2
(45) Date of Patent: Feb. 23, 2021

(54) METHOD OF INCREASING THE RESISTANCE TO INTERNAL PRESSURE OF A GLASS CONTAINER

(71) Applicant: PILKINGTON GROUP LIMITED, Lathom (GB)

(72) Inventors: Kevin David Sanderson, Upholland (GB); Deborah Raisbeck, Burscough (GB)

(73) Assignee: Pilkington Group Limited, Lathom (GB)

( * ) Notice: Subject to any disclaimer, the term of this patent is extended or adjusted under 35 U.S.C. 154(b) by 25 days.

(21) Appl. No.: 16/061,690

(22) PCT Filed: Dec. 29, 2016

(86) PCT No.: PCT/GB2016/054085
§ 371 (c)(1),
(2) Date: Jun. 13, 2018

(87) PCT Pub. No.: WO2017/115086
PCT Pub. Date: Jul. 6, 2017

(65) Prior Publication Data
US 2018/0362394 A1    Dec. 20, 2018

(30) Foreign Application Priority Data

Dec. 31, 2015 (GB) ..................... 1523156

(51) Int. Cl.
*C23C 16/40* (2006.01)
*C03C 17/34* (2006.01)
(Continued)

(52) U.S. Cl.
CPC ........ *C03C 17/3417* (2013.01); *B65D 1/0207* (2013.01); *C03C 17/005* (2013.01);
(Continued)

(58) Field of Classification Search
CPC ..... C23C 16/40; C23C 16/401; C23C 16/402; C23C 16/407; C03C 17/3417; C03C 2218/152; C03C 2218/1525; B65D 1/0207
See application file for complete search history.

(56) References Cited

U.S. PATENT DOCUMENTS

| | | |
|---|---|---|
| 3,378,396 A | 4/1968 | Zaromb |
| 4,961,796 A | 10/1990 | Perrin et al. |
| | (Continued) | |

FOREIGN PATENT DOCUMENTS

| | | |
|---|---|---|
| DE | 102012015351 A1 | 2/2014 |
| EP | 0485646 A1 | 5/1992 |
| | (Continued) | |

OTHER PUBLICATIONS

Gordon, Roy, "Chemical vapor deposition of coatings on glass". Journal of Non-Crystalline Solids 218 (1997) 81-91.*
(Continued)

*Primary Examiner* — Bret P Chen
(74) *Attorney, Agent, or Firm* — Marshall & Melhorn, LLC

(57) ABSTRACT

A method for coating glass containers provides improved tensile strength (hence improved resistance to internal pressure). The method lends itself in particular to implementation as part of a continuous production process by utilising residual heat from the bottle casting step. The use of residual heat from an existing process offer considerable environmental benefits.

18 Claims, 3 Drawing Sheets

(51) Int. Cl.
  *C03C 17/00* (2006.01)
  *C23C 16/54* (2006.01)
  *B65D 1/02* (2006.01)
(52) U.S. Cl.
  CPC .......... *C23C 16/402* (2013.01); *C23C 16/407* (2013.01); *C23C 16/54* (2013.01); *C03C 2218/152* (2013.01); *C03C 2218/1525* (2013.01)

(56) References Cited

U.S. PATENT DOCUMENTS

| | | | | |
|---|---|---|---|---|
| 5,059,254 | A * | 10/1991 | Yaba | B32B 17/10018 |
| | | | | 136/244 |
| 5,149,351 | A * | 9/1992 | Yaba | B60J 7/04 |
| | | | | 257/E27.125 |
| 5,527,596 | A * | 6/1996 | Kimock | B32B 17/06 |
| | | | | 428/216 |
| 5,584,903 | A | 12/1996 | Guthrie et al. | |
| 6,106,892 | A | 8/2000 | Ye | |
| 6,238,738 | B1 * | 5/2001 | McCurdy | C03C 17/2453 |
| | | | | 427/166 |
| 6,838,178 | B1 * | 1/2005 | Strickler | C03C 17/3417 |
| | | | | 428/432 |
| 7,029,769 | B2 | 4/2006 | Ohmori et al. | |
| RE41,799 | E | 10/2010 | Russo et al. | |
| 8,940,396 | B1 | 1/2015 | Sharma | |
| 9,090,503 | B2 | 7/2015 | Sharma et al. | |
| 2004/0214010 | A1 | 10/2004 | Murata et al. | |
| 2005/0271893 | A1 | 12/2005 | Kobrin et al. | |
| 2007/0281168 | A1 * | 12/2007 | Varanasi | C03C 17/3417 |
| | | | | 428/426 |
| 2009/0104369 | A1 * | 4/2009 | Rajala | C03C 17/001 |
| | | | | 427/475 |
| 2009/0232985 | A1 * | 9/2009 | Dussarrat | C23C 16/402 |
| | | | | 427/255.28 |
| 2010/0221556 | A1 * | 9/2010 | Koyama | B82Y 30/00 |
| | | | | 428/446 |
| 2010/0255225 | A1 | 10/2010 | Cording et al. | |
| 2010/0307559 | A1 * | 12/2010 | Yamazaki | H01L 31/048 |
| | | | | 136/244 |
| 2011/0155685 | A1 | 6/2011 | Kutilek et al. | |
| 2012/0217181 | A1 | 8/2012 | Click et al. | |
| 2012/0295155 | A1 * | 11/2012 | Deng | H01B 1/122 |
| | | | | 429/200 |
| 2013/0068295 | A1 * | 3/2013 | Becker | H01L 31/022425 |
| | | | | 136/256 |
| 2013/0334089 | A1 | 12/2013 | Remington, Jr. | |
| 2014/0023860 | A1 * | 1/2014 | Kodaira | C03C 17/326 |
| | | | | 428/336 |
| 2016/0086683 | A1 * | 3/2016 | Hara | H01L 31/02246 |
| | | | | 428/336 |
| 2016/0124120 | A1 * | 5/2016 | Varanasi | G02B 1/116 |
| | | | | 359/586 |
| 2016/0319429 | A1 | 11/2016 | Sanderson et al. | |
| 2017/0355638 | A1 * | 12/2017 | Varanasi | C03C 17/245 |
| 2018/0009703 | A1 * | 1/2018 | Hayashi | C03C 17/2453 |
| 2018/0009704 | A1 * | 1/2018 | Krasnov | C03C 17/2456 |

FOREIGN PATENT DOCUMENTS

| | | | |
|---|---|---|---|
| EP | 0519597 A1 | 12/1992 | |
| EP | 0727397 A2 | 8/1996 | |
| GB | 1486756 A | 9/1977 | |
| JP | H08231244 A | 9/1996 | |
| JP | 10-125329 | * 5/1998 | |
| JP | 2004527651 A | 9/2004 | |
| JP | 2010065320 A | 3/2010 | |
| WO | 9312934 A1 | 7/1993 | |
| WO | WO 96/26163 | * 8/1996 | .......... C03C 17/245 |
| WO | 9806675 A1 | 2/1998 | |
| WO | WO 98/06675 | * 2/1998 | .......... C03C 17/00 |
| WO | 0227063 A2 | 4/2002 | |
| WO | 2010107998 A1 | 9/2010 | |
| WO | 2015054189 A1 | 4/2015 | |
| WO | 20150541189 A1 | 4/2015 | |
| WO | 2015075434 A1 | 5/2015 | |

OTHER PUBLICATIONS

Krohn, Matthew H., et al., "Effect of tin-oxide on the physical properties of soda-lime-silica glass". Journal of Non-Crystalline Solids 351 (2005) 455-465.*

Hamelmann, Frank U, "Transparent Conductive Oxides in Thin Film Photovoltaics". J. Phys.: Conf. Ser. 559 (2014) 012016, pp. 1-9.*

"Glass Making Today"; edited by P. J. Doyle; Portcullis Press, pp. 207-211; ISBN 0 86108 047 5.

* cited by examiner

METHOD OF INCREASING THE RESISTANCE TO INTERNAL PRESSURE OF A GLASS CONTAINER

BACKGROUND OF THE INVENTION

The invention concerns a method for increasing the strength and durability of glass containers, particularly their ability to withstand internal pressure. The invention also concerns glass containers produced by said method.

In a number of applications, glass containers are required to hold pressurised contents. For example, glass bottles are a favoured storage and transit container for beer or carbonated drinks, and must be able to withstand significantly higher pressures on the interior surfaces than on the outside. The bottle's ability to withstand this higher internal pressure is referred to as its 'burst strength'.

On the other hand, glass is a fairly heavy material which makes it more expensive and inconvenient to handle and transport. Since the burst strength of a glass container increases with its thickness, any attempt to reduce its weight by reducing its thickness will result in a reduced burst strength. Any attempt to improve the burst strength by increasing the thickness will result in an increased weight.

Thus, any means of increasing the burst strength of a glass container of a given thickness, without increasing that thickness would be particularly beneficial.

U.S. Pat. No. 4,961,796A describes a method of improving the strength of a glass container by applying a coating material which cures when subjected to radiation of suitable energy.

U.S. Pat. No. 7,029,768 B1 describes a food container on which surface titanium oxide particles are fixed by bonding, using a sintering aid or both. Where the container is formed of glass, an increased mechanical strength is observed.

US 2012217181 A1 describes a glass container having a hybrid sol-gel coating across at least a portion of its exterior.

U.S. Pat. No. 9,090,503 B2 discloses Methods of manufacturing and coating a glass container by applying an aminofunctional silane coating composition to an exterior surface of the glass container, and then curing the silane coating composition to form a crosslinked siloxane coating on the exterior surface of the glass container.

U.S. Pat. No. 8,940,396 B1 discloses a glass container and a process for forming a graphene-containing coating on an exterior surface of the glass container to increase the strength of the glass container.

The manufacture of glass bottles or jars by modern methods is well known (see for example "Glass Making Today"; edited by P. J. Doyle; Portcullis Press, ISBN 0 86108 047 5). Typically, a blank shape is first formed by blowing or pressing a slug or 'Gob' of molten glass against the walls of a blank mould. The 'blank' so formed is transferred to a 'blow' mould where the final shape of the article is imparted by blowing against the interior of the latter. Variations on this process may occur but modern production methods typically give rise to a shaped glass container emerging from a mould, the container still bearing significant residual heat from the shaping process.

The deposition of tin (IV) oxide on glass bottles during production, by chemical vapour deposition (CVD) techniques, is also known. Monobutyl tintrichloride is a preferred precursor which is directed to the surface of hot bottles, where it decomposes and the desired coating is formed. The tin (IV) oxide coating offers a number of benefits including improved adherence of a subsequent protective polymer layer.

SUMMARY OF THE INVENTION

According to the invention, a method of increasing the resistance of a glass container to internal pressure comprises the steps set out in claim 1 attached hereto.

In a preferred embodiment, the container is provided with a temperature of between 450° C. and 650° C. More preferably, the temperature is provided by residual heat from casting of the glass container.

Preferably the precursor of silicon dioxide comprises di-tert-butoxy-di-acetoxysilane.

Preferably, the one or more precursors of tin (IV) oxide includes monobutyl tin trichloride.

Preferably at least one of the first and second carrier gases comprises nitrogen.

Preferably, the oxide of silicon and the tin (ii) oxide are deposited to a total thickness of between 30 and 60 coating thickness units (CTU).

Preferably, the first mixture comprising a precursor of silicon oxide and a first carrier gas is directed to the surface of the container by:

arranging a tunnel on a conveyor belt such that the conveyor belt transports the glass container from an upstream end, at which articles enter the tunnel, to a downstream end, at which articles exit the tunnel, the tunnel having a top and first and second sidewalls;

a linear array of nozzles, arranged on at least one side wall to deliver a jet of gas, which jet traverses the path of articles conveyed through the tunnel;

at least one exhaust aperture arranged on a sidewall, the exhaust aperture being located closer to the downstream end than the linear array of nozzles and means for applying a negative pressure to the exhaust aperture;

and further providing an evaporator comprising a heatable tube;

directing a carrier gas stream through the evaporator to one or more of the nozzles;

introducing the precursor to silicon dioxide to the carrier gas stream in the evaporator and introducing a diluent gas to the carrier gas stream after it passes from the evaporator and before it reaches the one or more nozzles.

Preferably the precursor of silicon dioxide comprises di-tert-butoxy-di-acetoxysilane.

Preferably, the di-tert-butoxy-di-acetoxysilane is introduced to the evaporator at a rate of between 5 and 30 cc/minute, more preferably between 20 and 30 cc/min.

Preferably, the carrier gas is directed through the evaporator at a rate of 5-30 slm, more preferably between 20 and 30 slm.

Preferably, the evaporator is heated to a temperature of between 190 and 225° C., more preferably between 195 and 220° C.

Preferably, the diluent gas is added at a rate of between 30 and 60 slm, more preferably between 35 and 55 slm.

Preferably, an extraction pressure of between 80 and 120 Pa, more preferably between 90 and 120 Pa, is applied to the at least one exhaust aperture.

Preferably one or both of the carrier gas and the diluent gas comprises nitrogen.

BRIEF DESCRIPTION OF THE DRAWINGS

The invention will now be described by non-limiting example, with reference to the appended figures in which.

DETAILED DESCRIPTION OF THE INVENTION

Figure 1A:
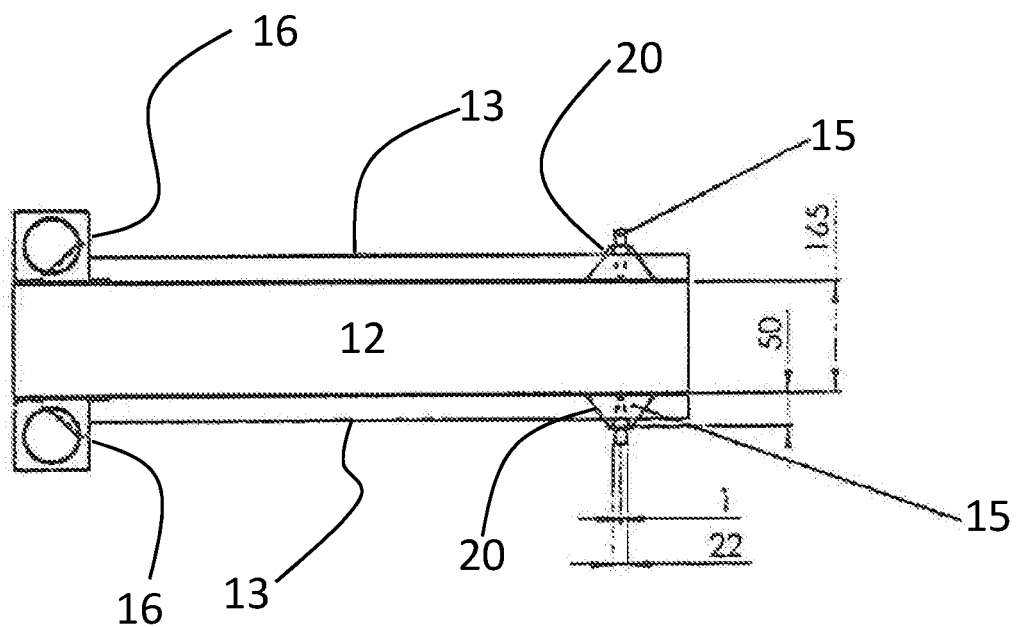
FIGS. 1a-1d and 2 illustrate apparatus that may be used to perform the method of the invention.
Figure 1B:
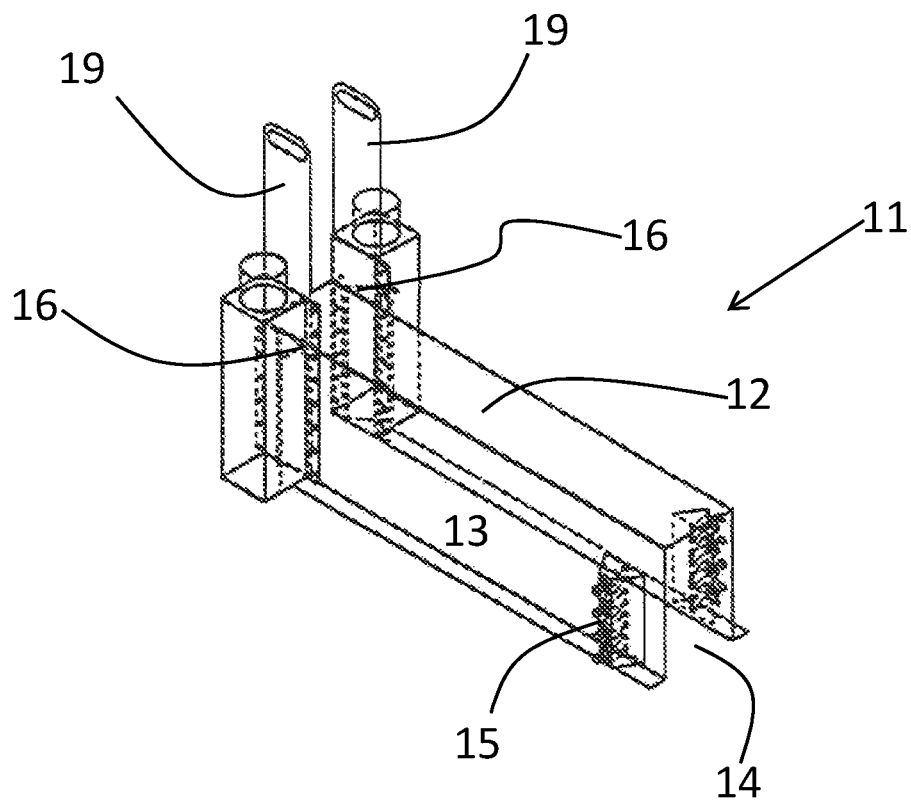
Figure 1C:
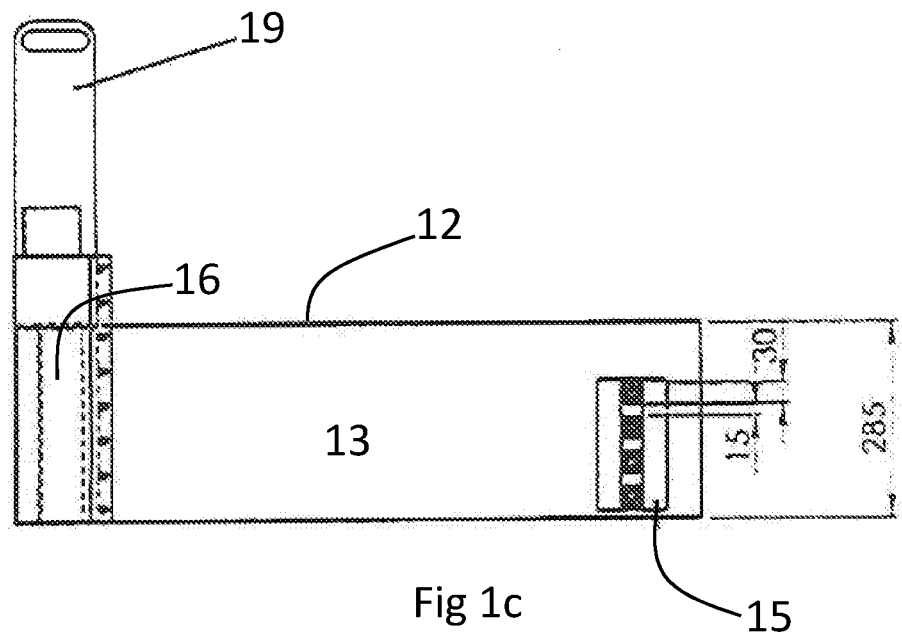
Figure 1D:
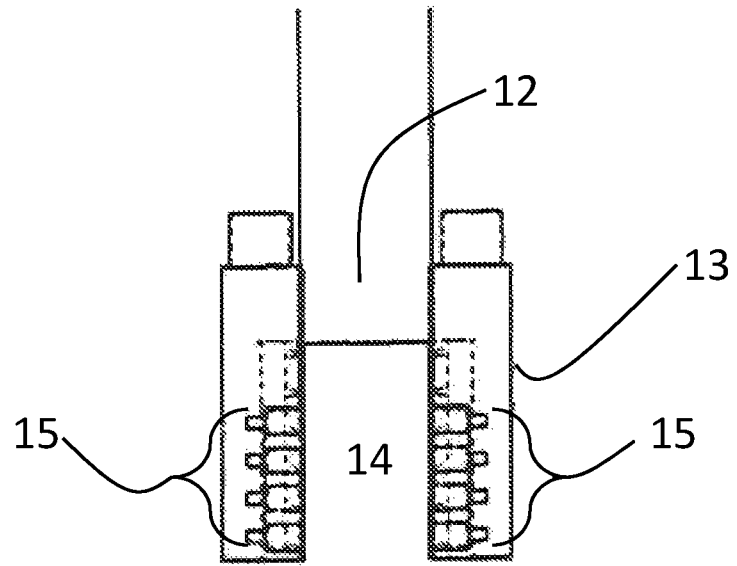

The inventors have shown that inclusion of a silica layer on the container surface, prior to deposition of a tin (IV) oxide coating, significantly improves the bursts strength of the container relative to an uncoated container or a container coated with tin (IV) oxide coating only. Durability of the coating is also improved and the susceptibility of the $SnO_2$ coating to 'blow out'—where small areas of the coating become detached from the substrate—is reduced.

Examples 1

Following initial experimental data, which suggested these benefits of a silica layer under a tin (IV) oxide layer, a series of work was performed to develop a method for depositing these coatings on glass bottles by CVD, during a continuous process for manufacturing glass bottles, and evaluating bottles so produced.
Deposition of Silica Layer The silica coatings were deposited directly on the glass bottles at the 'hot end' of the continuous production cycle, that is at a point in the cycle soon after the bottles emerge from the blank and while they still bear residual heat from the casting step.

Referring to FIGS. 1a-1d, apparatus used for depositing a first silica layer on bottles, according to the invention, comprises a hood 11 having a top 12 and sidewalls 13 defining a tunnel 14 through which articles to be coated are conveyed by a conveyor belt (not shown).

At least one pair of linear arrays of inlet nozzles 15 is provided, one array 15 from the pair being located on each sidewall 13. Preferably each of the pair are located at substantially the same distance along the path of the articles (i.e. they are located substantially opposite each other). (N.B. while a pair of nozzle arrays is illustrated in this embodiment, a single array is adequate for some chemistries).

Further along the path of the articles, at least one pair of exhaust apertures 16 is provided, again one from the pair on each sidewall 13 and preferably substantially opposite each other.

During operation, chemical precursors of the coating to be deposited are directed to the interior of the tunnel via inlet nozzles 15 and travel along the tunnel in substantially the same direction (23 of FIGS. 2 and 4) of the glass articles. This arrangement of inlet nozzles 15 and exhaust apertures 16 provides for a more effective exposure of the articles to CVD reactants during transit through the hood. Exposure is enhanced as the gaseous CVD reactants and bottles travel in the same direction through the tunnel. The minimum recommended distance between inlet nozzles 15 and exhaust apertures 16 varies according to the particular chemistry being practiced and ranges from 500 mm to 1000 mm.

The effective length of exhaust apertures 16 may be varied by adjusting the height of damper 19. Damper 19 comprises a plate arranged to block a part of the slot forming the exhaust apertures CVD reactants may be delivered to the nozzles 15 via heated delivery lines (not shown) in order to prevent condensation of vapour before it enters the hood. In some circumstances, formation of liquid can occur at the nozzles and the hood described here includes reflective plates 20, arranged to direct thermal radiation from the articles on to the nozzles in order to provide heating thereof.

Figure 2:
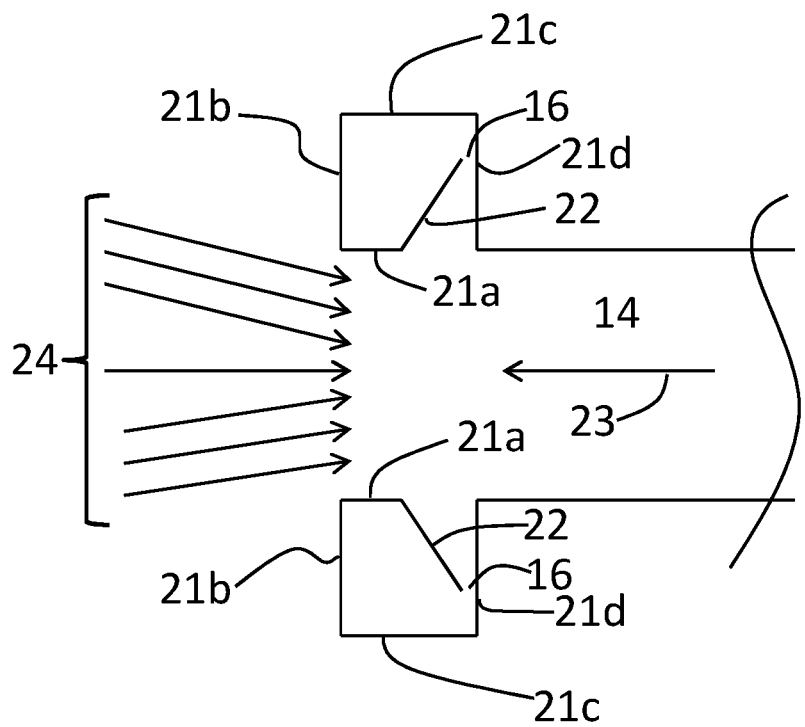

Referring to FIG. 2, the exhaust arrangement is shown in plan view. Walls 21a-21d define substantially box-section conduits with baffle plate 22 defining a slot type aperture 16 with wall 21d. Walls 21a are coincident with the interior of the tunnel and walls 21d are furthest upstream, having regard to the general direction 23 of gases and articles passing through the tunnel. Thus, baffle plates 22 are arranged to extend from the interior of the tunnel to define a slot 16 between baffle plate 22 and the wall 21d which is furthest upstream. A negative pressure is applied to the top of the conduit by an extractor fan (not shown).

The inventors have found this arrangement especially effective in drawing exhaust gases from the hood. This arrangement not only draws exhaust gases and any excess reactant but ambient air is also drawn from the exit of the tunnel as illustrated by arrows 24. This air, entering the tunnel in the direction of arrows 24 provides a barrier to exhaust gases or excess reactants that might otherwise leak from the apparatus to the surroundings.

The total area of the slot 16 should be small, compared with the cross-sectional area of the conduit defined by walls 21a-21d and 22 to ensure uniform flow. However the smaller the area, the greater the suction that must be applied to the conduit for effective extraction and the final design choice represents a compromise between these two conflicting factors. A tunnel cross-sectional area to slot area ratio of between 1.5 and 2.5 is found to serve well (an area ratio of 1.6 represents about 10% variation in flow velocity when comparing the flow velocity at the top of the slot and the bottom).

The linear velocity of the CVD reactants exiting the nozzles 15 is an important factor in the achievement of effective coatings.

The articles enter the coating hood with a known velocity (typically 0.3 m/s to 1.5 m/s, or ~90 to 700 articles per minute). The motion of the articles drag a flow of gas through the coater in a fashion similar to the action of a train moving through a tunnel. This gas flow is also driven by suction from the two exhaust apertures 16. To gain a uniform coating on the articles, a jet of coating precursor is preferably blown into the flow path, in one embodiment, perpendicular to the direction of the articles 23 during transit through the hood. The jet must have sufficient momentum so that a concentrated plume of coating gases is directed onto the centre line of the articles' motion. The process becomes inefficient if the highly concentrated plume of coating gases is instead directed to either wall 13 of the coating hood 11.

The choice of jet velocity is optimally identified by fluid flow modelling, but an approximate measure can be found by considering a fluid "kinetic energy ratio". The flow of gases moving along the coating hood has a kinetic energy density given by approximately $Kair = density\text{-}of\text{-}air \times width\text{-}of\text{-}coater \times bottle\text{-}velocity^2$ [units $J/m^2$]. The injected jets of coating precursor have a kinetic energy of approximately $Kjet = density\text{-}of\text{-}coating\text{-}precursor \times width\text{-}of\text{-}nozzle \times jet\text{-}velocity^2$ [unit $J/m^2$].

A kinetic energy density ratio $R = Kair/Kjet$ with $R = 0.5$ is preferred, but good coatings have been seen for $0.1 < R < 3$. If the inlet jet is faster than given by this ratio, i.e. the ratio R is too small, then the jet tends to pass through the path of the containers and is wasted on the opposing coating hood walls. If the inlet jet is slower than given by this ratio, the jet is not thrown far enough and the precursor is wasted on the wall adjoining the inlet nozzle. Similarly, if the coater hood must be made wider, then the jet velocity must increase to throw the jet far enough and so the jet velocity would be increased to maintain the target kinetic-energy ratio.

From this starting point, the velocity of the inlet jet is tuned during coating trials to give the thickest and most evenly distributed coating possible for the given chemistry and bottle velocity. For one particular coater dimensions and bottle velocity, an inlet jet of 8 m/s was found to be adequate with 0.5 m/s conveyor speed.

In the application used to generate the data below, the coating chamber was 165 mm wide, 285 mm tall and 1000 mm long. The coating chamber dimensions are chosen to give just enough room for the glass article to move through without causing crashes at the entrance. If the chamber is too small, then misalignment of glass containers on the conveyor can cause them to collide with the entrance to the coating hood.

A mask (not shown) is fitted to the entrance to the coating hood of approximately the same shape as the outline of the glass articles. This mask restricts the air drawn into the coating hood by the bottles and so gives a higher concentration of coating precursor inside the reaction chamber. The mask is designed to block as much air entering the start of the hood as possible without causing crashes of the glass containers on the conveyor.

The inlet nozzles are positioned at least 100 mm downstream of the entrance and preferably 300 mm. If the nozzles are close to the entrance, then coating gases escape from the entrance to the hood due to occasional backward travelling eddies in the coating plume. The length of the coating hood is chosen so that the chemical reaction has had sufficient time and distance to complete.

A pair of opposing vertical inlet nozzles are used in one embodiment as this helps to position the coating plume at the centre line of the coating hood. Using a nozzle on only one side of the hood may give a good enough coating uniformity for some applications.

The two exhaust ports at the end of the coating hood are specified to just prevent leakage from the end of the coater. The negative pressure on the exhaust slots is determined by fluid simulations. In the present case, the exhaust port has a 12 mm wide flow restriction which runs the full height of the exhaust port (285 mm). At least 100 Pa of suction behind the 12 mm flow restriction was found necessary to prevent gas leakage from the ends of the hood.

Care must be taken to ensure air cannot be drawn into the coating hood from underneath the conveyor belt. An adequate seal needs to be made between the edges of the conveyor belt and the coating hood.

Di-t-butoxydiacetoxysilane (DBDAS) served as the precursor for silica coatings. This was delivered to the coating hood via an evaporator of the type known in the art. Essentially this comprises a heated metal tube within which the reactant is dropped into a stream of carrier gas. Silica coatings were deposited using the following parameter ranges:

DBDAS delivery rate: 5-30 cc/min
Evaporator temperature: 200° C.
Evaporator carrier gas: nitrogen, 25 slm
Diluent gas (added to carrier gas stream): nitrogen, 40 slm.
Extraction pressure (applied to exhaust apertures 16)—100 Pa
(slm=standard litre per minute, a unite well known in the art which refers to volumetric gas flow corrected for standardized conditions of temperature and pressure).

Deposition of Tin (IV) Oxide Layer.

The tin oxide was deposited on top of the silica layer—also by CVD during continuous bottle manufacture. This was done by a method that is well known in the art, using monobutyltin trichloride (MBTC) as the precursor. MBTC readily decomposes in the vicinity of the hot glass surface to provide tin (IV) oxide. Again, residual heat from the bottle casting step facilitates the deposition reaction:

$$C_4H_9SnCl_3 + H_2O + 6O_2 \rightarrow SnO_2 + 2H_2O + 4CO_2 + 3HCL$$

The tin oxide was deposited using a coating apparatus that was similar to that described in EP0519597B1 but purging of the 'finish' as referred to therein was achieved by a horizontal protective stream in an arrangement similar to FIG. 1 therein.

For comparative purposes, a series of bottles coated with $SnO_2$ only, as is common in the industry, using the above chemistry, were also produced.

Figure 3:
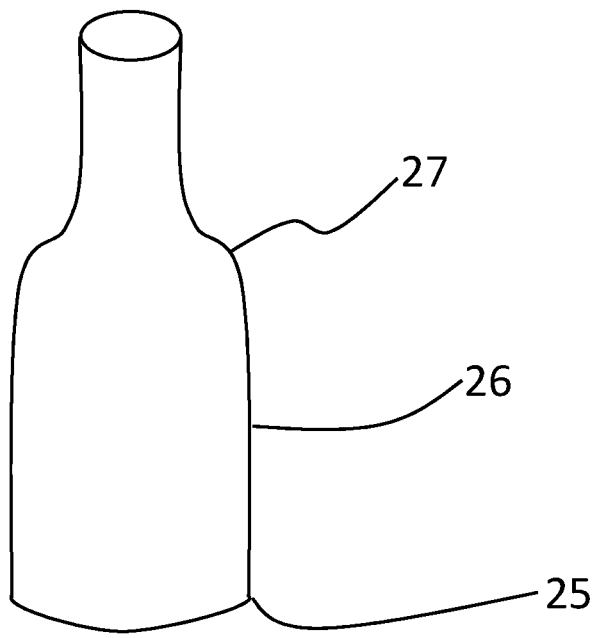
FIG. 3 illustrates locations on bottles, coated according to the invention, where coating thicknesses were measured.

Referring to FIG. 3, coating thicknesses were measured at the heel 25, body 26 and shoulder 27 of the bottles. Table 1 shows summary statistics of measurements taken around the circumference of the bottles at each of the three locations 25, 26 and 27.

Coating thicknesses are shown in Coating Thickness Units (CTU). This is an optical thickness unit that is well known in the glass industry. For oxide coatings as described herein, 1 coating thickness unit may be estimated to correspond with about 3 Angstrom.

TABLE 1

Summary Descriptive Statistics-Coating Thicknesses.

| Coating | $SnO_2$ | | | $SiO_2/SnO_2$ | | |
|---|---|---|---|---|---|---|
| Location | heel | body | shoulder | heel | body | shoulder |
| Min | 36 | 37 | 37 | 36 | 35 | 30 |
| Max | 58 | 63 | 59 | 55 | 60 | 52 |
| Average | 45 | 47 | 45 | 44 | 47 | 43 |
| Median | 44 | 47 | 44 | 44 | 47 | 43 |
| Std. Deviation | 4 | 4 | 3 | 5 | 5 | 4 |
| Overall Min | | 36 | | | 30 | |
| Overall Max | | 63 | | | 60 | |
| Overall Average | | 45 | | | 45 | |
| Overall Median | | 45 | | | 45 | |
| Overall Std. Deviation | | 4 | | | 5 | |

Standard $SnO_2$ and $SiO_2/SnO_2$ coatings were both of acceptable uniformity and thickness in shoulder, mid-sidewall and the heel region.

The coated bottles were then tested for internal pressure resistance using a Ramp Pressure Tester 2 (RPT2), provided by AGR International Inc., 615 Whitestown Road, Butler, Pa. 16001, USA. Failure pressure after 1, 5, 10 and 20 line cycle simulations was measured.

A line cycle represents is the repeated cycle of filling, emptying, washing (including caustic wash) that each bottle is subject to during its lifetime. These were simulated using a Line Simulator, which provides an accelerated and reproducible abuse treatment for evaluation of container designs in the laboratory environment. The Line Simulator is also provided by AGR International Inc.

The results of these measurements are shown in table 2, with pressures shown in psi.

TABLE 2

Summary statistics-Coated Bottle Internal Pressure Resistance

| | Internal Pressure Resistance | | | | | | | |
|---|---|---|---|---|---|---|---|---|
| | 1 cycle | | 5 cycles | | 10 cycles | | 20 cycles | |
| | $SnO_2$ | $SiO_2/SnO_2$ | $SnO_2$ | $SiO_2/SnO_2$ | $SnO_2$ | $SiO_2/SnO_2$ | $SnO_2$ | $SiO_2/SnO_2$ |
| Min | 238 | 383 | 245 | 284 | 187 | 210 | 181 | 214 |
| Max | 624 | 556 | 586 | 543 | 369 | 414 | 327 | 335 |
| Ave | 452 | 453 | 375 | 385 | 251 | 294 | 231 | 281 |
| Med | 472 | 435 | 356 | 382 | 237 | 288 | 223 | 287 |
| S.D. | 167 | 60 | 102 | 67 | 39 | 45 | 33 | 29 |

The results in table 2 indicate that the $SiO_2/SnO_2$ coated bottles were consistently resistant to higher internal pressure than bottles having only the standard $SnO_2$ coating (about 15-20% improvement).

The glass thickness of the bottles was also determined and these measurements are summarised in table 3 (thicknesses are quoted in inches).

TABLE 3

Summary statistics-Coated Bottle Glass Thickness after Washing Cycles

| | Glass Thickness | | | | | | | |
|---|---|---|---|---|---|---|---|---|
| | 1 cycle | | 5 cycles | | 10 cycles | | 20 cycles | |
| | $SnO_2$ | $SiO_2/SnO_2$ | $SnO_2$ | $SiO_2/SnO_2$ | $SnO_2$ | $SiO_2/SnO_2$ | $SnO_2$ | $SiO_2/SnO_2$ |
| Min | 0.065 | 0.067 | 0.058 | 0.059 | 0.055 | 0.059 | 0.053 | 0.055 |
| Max | 0.173 | 0.116 | 0.115 | 0.134 | 0.095 | 0.101 | 0.139 | 0.095 |
| Ave | 0.102 | 0.083 | 0.076 | 0.084 | 0.072 | 0.078 | 0.076 | 0.077 |
| Med | 0.086 | 0.077 | 0.072 | 0.085 | 0.072 | 0.075 | 0.074 | 0.075 |
| S.D. | 0.048 | 0.017 | 0.015 | 0.014 | 0.010 | 0.011 | 0.016 | 0.011 |

Tensile breaking strength of the coated bottles was determined from an analysis of the internal pressure resistance data, wall thickness data and fracture analyses. This service is provided by AGR International Inc. The results of this determination are summarised in table 4 (units are PSI).

TABLE 4

Summary statistics-Coated Bottle Tensile Strength after Washing Cycles

| | Tensile Breaking Strength | | | | | | | |
|---|---|---|---|---|---|---|---|---|
| | 1 cycle | | 5 cycles | | 10 cycles | | 20 cycles | |
| | $SnO_2$ | $SiO_2/SnO_2$ | $SnO_2$ | $SiO_2/SnO_2$ | $SnO_2$ | $SiO_2/SnO_2$ | $SnO_2$ | $SiO_2/SnO_2$ |
| Min | 6855 | 4321 | 5734 | 5469 | 4269 | 4749 | 4781 | 5689 |
| Max | 17040 | 12534 | 10963 | 10930 | 8625 | 8713 | 8936 | 13501 |
| Ave | 11173 | 9932 | 7765 | 7507 | 5973 | 6541 | 5978 | 7209 |
| Med | 10399 | 10708 | 7508 | 7350 | 5944 | 6643 | 5962 | 6870 |
| S.D. | 4253 | 2541 | 1505 | 1165 | 798 | 922 | 830 | 1556 |

The tensile strength measurements summarised in table 4 suggest an improvement of about 20% in the $SiO_2/SnO_2$ coated bottles over those coated with $SnO_2$ only.

Examples 2

Further trials were performed in order to optimise conditions for CVD deposition of silica on glass containers as part of a continuous production process. Table 5 shows the results of depth profile analysis, performed by Time Of Flight Secondary Ion Mass Spectroscopy (TOF-SIMS), on samples obtained using the following reaction parameters:
DBDAS delivery rate: 25 cc/min
Evaporator temperature: 215° C.
Evaporator carrier gas: nitrogen, 25 slm
Diluent gas (added to carrier gas stream): nitrogen, 50 slm.
Extraction pressure (applied to exhaust apertures 16)—100 Pa
Delivery lines and nozzle manifolds were heated to 180-200° C. using resistive heating tapes.
The numerals #1, #3, #5 and #7 correspond to four equally spaced points around the bottle at the shoulder or heel of the bottle as the case may be.

TABLE 5

Coating thicknesses for $SiO_2/SnO_2$ samples.

| | Layer Thickness (nm) | | |
|---|---|---|---|
| Sample ID | SnOx | SiOx | Total |
| 2 Nozzle "Shoulder" Bottle 3 #1 | 10 | 9 | 19 |
| 2 Nozzle "Shoulder" Bottle 3 #3 | 10 | 5 | 15 |
| 2 Nozzle "Shoulder" Bottle 3 #5 | 11 | 6 | 17 |
| 2 Nozzle "Shoulder" Bottle 3 #7 | 8 | 9 | 17 |
| Mean | 9.8 | 7.3 | 17.0 |
| S.D. | 1.3 | 2.1 | 1.6 |
| S.D. % | 12.9 | 28.4 | 9.6 |
| 2 Nozzle "Heel" Bottle 3 #1 | 13 | 12 | 25 |
| 2 Nozzle "Heel" Bottle 3 #3 | 11 | 12 | 23 |
| 2 Nozzle "Heel" Bottle 3 #5 | 16 | 14 | 30 |
| 2 Nozzle "Heel" Bottle 3 #7 | 13 | 14 | 27 |
| Mean | 13.3 | 13.0 | 26.3 |
| S.D. | 2.1 | 1.2 | 3.0 |
| S.D. % | 15.6 | 8.9 | 11.4 |

Uniformity of coatings is an important feature because if the coating thickness varies too much, this can give rise to optical effects which are undesirable in the finished product. The coated bottles on which table 5 is based exhibited no such effects. These data represent a total coating thickness in the approximate range 19 to 25 nm having a thickness variation of approximately 5 nm.

Thus the inventors have provided a method with reaction conditions, for coating glass containers to provide improved tensile strength (hence improved resistance to internal pressure). The method lends itself in particular to implementation as part of a continuous production process by utilising residual heat from the bottle casting step.

The use of residual heat from an existing process offer considerable environmental benefits.

The invention claimed is:

1. A method of increasing the resistance to internal pressure of a glass container comprising the steps of:
    directing a first mixture comprising a precursor of silicon oxide and a first carrier gas to the surface of the container, thereby to deposit a layer comprising an oxide of silicon on the glass and
    directing a second mixture comprising one or more precursors of tin (IV) oxide and a second carrier gas, which may be the same or different from the first carrier gas, to the surface of the container, thereby to deposit a layer comprising tin (IV) oxide on the oxide of silicon,
    wherein the first mixture comprising a precursor of silicon oxide and a first carrier gas is directed to the surface of the container by:
    arranging a tunnel on a conveyor belt such that the conveyor belt transports the glass container from an upstream end, at which articles enter the tunnel, to a downstream end, at which articles exit the tunnel,
    the tunnel having a top and first and second sidewalls;
    a linear array of nozzles, arranged on at least one side wall to deliver a jet of gas, which jet traverses the path of articles conveyed through the tunnel;
    at least one exhaust aperture arranged on a sidewall, the exhaust aperture being located closer to the downstream end than the linear array of nozzles and
    means for applying a negative pressure to the exhaust aperture;
    and further providing an evaporator comprising a heatable tube;
    directing a carrier gas stream through the evaporator to one or more of the nozzles;
    introducing the precursor to silicon dioxide to the carrier gas stream in the evaporator and introducing a diluent gas to the carrier gas stream after it passes from the evaporator and before it reaches the one or more nozzles.

2. The method according to claim 1, wherein the container is provided with a temperature of between 450° C. and 650° C.

3. The method according to claim 2, wherein the first and second mixtures are directed to the surface of the container during a continuous manufacturing process for glass containers, and wherein the temperature of between 450° C. and 650° C. is provided by residual heat from casting of the glass container.

4. The method according to claim 1, wherein the precursor of silicon dioxide comprises di-tert-butoxy-di-acetoxysilane.

5. The method according to claim 4, wherein the di-tert-butoxy-di-acetoxysilane is introduced to the evaporator at a rate of between 5 and 30 cc/minute.

6. The method according to claim 4, wherein the di-tert-butoxy-di-acetoxysilane is introduced to the evaporator at a rate of between 20 and 30 cc/min.

7. The method according to claim 1, where the one or more precursors of tin (IV) oxide includes monobutyl tin trichloride.

8. The method according to claim 1, wherein at least one of the first and second carrier gases comprises nitrogen.

9. The method according to claim 1, wherein the oxide of silicon and the tin (ii) oxide are deposited to a total thickness of between 30 and 60 coating thickness units (CTU).

10. The method according to claim 1, wherein the carrier gas is directed through the evaporator at a rate of 5-30 slm.

11. The method according to claim 1, wherein the carrier gas is directed through the evaporator at a rate of between 20 and 30 slm.

12. The method according to claim 1, wherein the evaporator is heated to a temperature of between 190 and 225° C.

13. The method according to claim 1, wherein the evaporator is heated to a temperature of between 195 and 220° C.

14. The method according to claim 1, wherein the diluent gas is added at a rate of between 30 and 60 slm.

15. The method according to claim 1, wherein the diluent gas is added at a rate of between 35 and 55 slm.

16. The method according to claim 1, wherein an extraction pressure of between 80 and 120 Pa is applied to the at least one exhaust aperture.

17. The method according to claim 1, wherein an extraction pressure of between 90 and 120 Pa is applied to the at least one exhaust aperture.

18. The method according to claim 1, wherein the diluent gas comprises nitrogen.

* * * * *